(12) United States Patent
Michaeli

(10) Patent No.: US 10,157,004 B2
(45) Date of Patent: Dec. 18, 2018

(54) STORAGE SYSTEM AND METHOD FOR RECOVERING DATA CORRUPTED IN A HOST MEMORY BUFFER

(71) Applicant: SanDisk Technologies Inc., Plano, TX (US)

(72) Inventor: Eliyahu Michaeli, Jerusalem (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/099,018

(22) Filed: Apr. 14, 2016

(65) Prior Publication Data
US 2017/0300246 A1 Oct. 19, 2017

(51) Int. Cl.
| | | |
|---|---|---|
| *G11C 29/00* | (2006.01) | |
| *G06F 3/06* | (2006.01) | |
| *G06F 11/10* | (2006.01) | |
| *G06F 12/02* | (2006.01) | |
| *G11C 29/52* | (2006.01) | |

(Continued)

(52) U.S. Cl.
CPC ............ *G06F 3/0619* (2013.01); *G06F 3/065* (2013.01); *G06F 3/0653* (2013.01);
(Continued)

(58) Field of Classification Search
CPC ...... G06F 3/0619; G06F 3/065; G06F 3/0688; G06F 11/1004; G06F 12/0246; G11C 29/52
See application file for complete search history.

(56) References Cited

U.S. PATENT DOCUMENTS 8,112,574 B2 * 2/2012 Lee ...................... G06F 12/0246
202/206
9,170,938 B1 * 10/2015 Walsh ................. G06F 12/0246
(Continued)

FOREIGN PATENT DOCUMENTS

EP 2 282 267 A1 2/2011

OTHER PUBLICATIONS

"Marvell's Industry-Leading SSD Controller Technology Expands the NVMe Host Memory Buffer Ecosystem", printed from the Internet at https://www.printhis.clickability.com/pt/cpt?expire=&title=Marvell%27s+Industry-Leading . . . dated Mar. 1, 2016, 4 pgs.
(Continued)

*Primary Examiner* — Esaw T Abraham
(74) *Attorney, Agent, or Firm* — Brinks Gilson & Lione

(57) ABSTRACT

A storage system and method for recovering data corrupted in a host memory buffer are provided. In one embodiment, a storage system is provided comprising a non-volatile memory and a controller in communication with the non-volatile memory. The controller is configured to receive a logical-to-physical map from a volatile memory of a host for storage in the storage system's non-volatile memory; determine if there is an error in an entry in the logical-to-physical map; in response to determining that there is no error in the logical-to-physical map, store the logical-to-physical map in the non-volatile memory; and in response to determining that there is an error in an entry in the logical-to-physical map, attempt to recover the entry from a location in the storage system before storing the logical-to-physical map in the non-volatile memory. Other embodiments are provided.

16 Claims, 7 Drawing Sheets

(51) Int. Cl.
*G06F 11/14* (2006.01)
*G11C 29/04* (2006.01)

(52) U.S. Cl.
CPC .......... *G06F 3/0679* (2013.01); *G06F 3/0688* (2013.01); *G06F 11/1004* (2013.01); *G06F 11/1072* (2013.01); *G06F 11/1402* (2013.01); *G06F 12/0246* (2013.01); *G11C 29/52* (2013.01); *G11C 29/765* (2013.01); *G06F 2212/7201* (2013.01); *G11C 2029/0411* (2013.01)

(56) References Cited

U.S. PATENT DOCUMENTS

| 9,177,607 | B2 * | 11/2015 | Yulizar ................. G11B 27/36 |
| 9,218,277 | B2 * | 12/2015 | Cherubini ........... G06F 12/0246 |
| 9,268,682 | B2 * | 2/2016 | Tomlin ................ G06F 12/0246 |
| 9,384,088 | B1 * | 7/2016 | Jones ................... G06F 11/1064 |
| 9,423,972 | B2 * | 8/2016 | Welker ................. G06F 3/0659 |
| 2010/0070735 | A1 | 3/2010 | Chen et al. |
| 2014/0136753 | A1 | 5/2014 | Tomlin et al. |
| 2014/0337560 | A1 | 11/2014 | Chun et al. |

OTHER PUBLICATIONS

Jeroen Dorgelo and Mike Chaowei Chen, "Host Memory Buffer (HMB) based on SSD System", Forum J-31: PCIe/NVMe Storage, Marvell, Flash Memory Summit 2015, dated Aug. 13, 2015, 17 pgs.
International Search Report and Written Opinion in corresponding International Application No. PCT/US2017/018882, dated May 23, 2017, 16 pages.

* cited by examiner

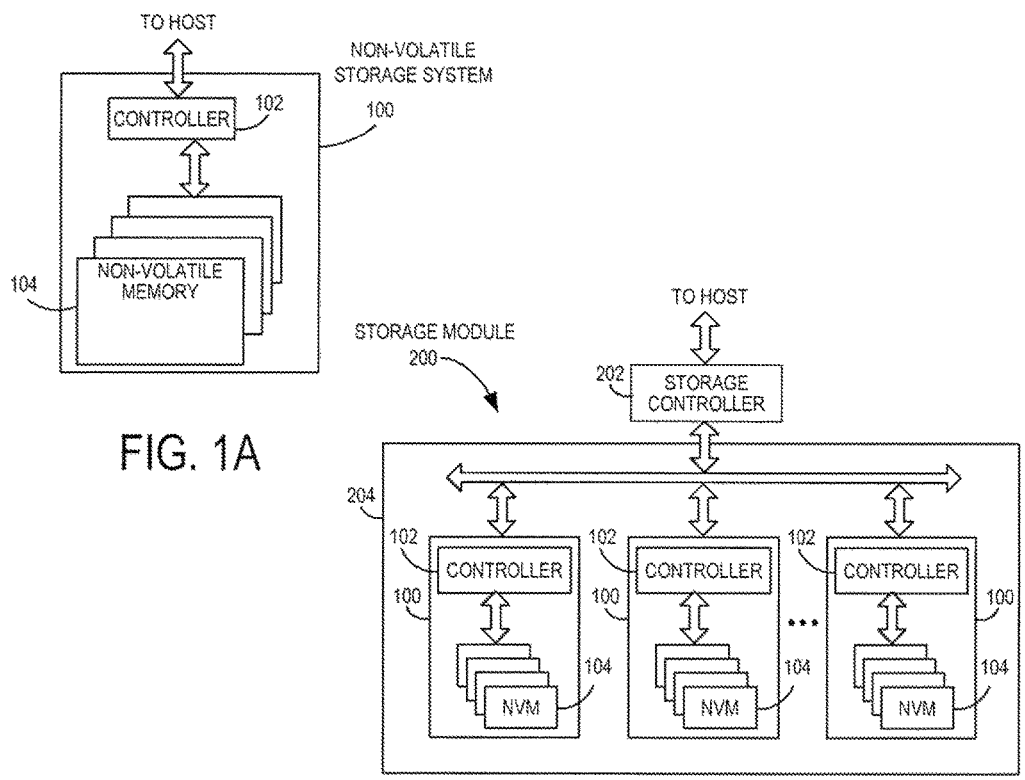
FIG. 1A
FIG. 1B
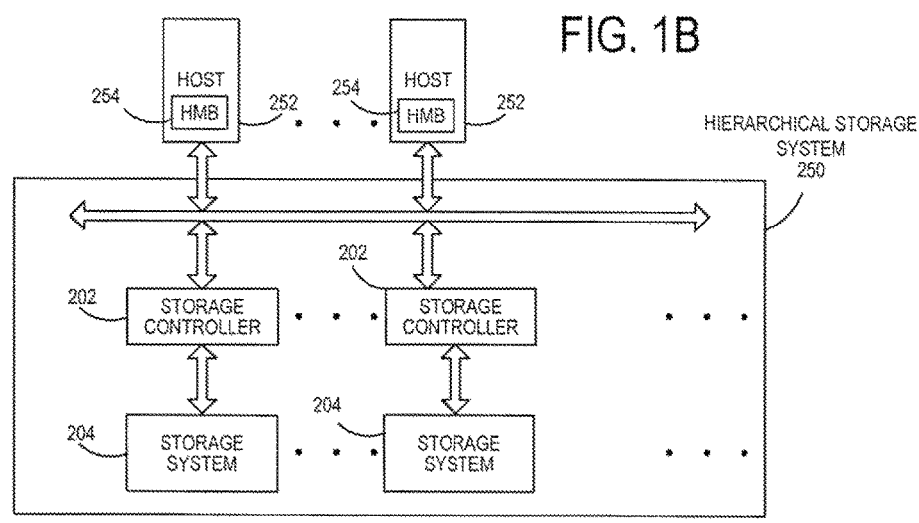
FIG. 1C

STORAGE SYSTEM AND METHOD FOR RECOVERING DATA CORRUPTED IN A HOST MEMORY BUFFER

BACKGROUND

Some storage systems, such as solid-state drives (SSDs), contain a non-volatile memory that is organized by physical addresses. A host uses logical addresses to read data from and/or write data to the storage system, and the storage system stores a logical-to-physical address map that the controller uses to translate a logical address from the host into a physical address of the non-volatile memory. The logical-to-physical address map is typically stored in the non-volatile memory; however, it is faster to access the logical-to-physical address map if it is stored in the storage system's volatile memory. In many situations, the storage system's volatile memory is not large enough to store the entire logical-to-physical address map, so portions of the logical-to-physical address map that are mostly-likely needed are read out of the slower non-volatile memory and into the faster volatile memory. Over time, portions of the logical-to-physical address map are swapped between the volatile and non-volatile memories.

BRIEF DESCRIPTION OF THE DRAWINGS

FIG. 1A is a block diagram of a non-volatile storage system of an embodiment.

FIG. 1B is a block diagram illustrating an exemplary storage module of an embodiment.

FIG. 1C is a block diagram illustrating a hierarchical storage system of an embodiment.

DETAILED DESCRIPTION

Overview

Figure 2A:
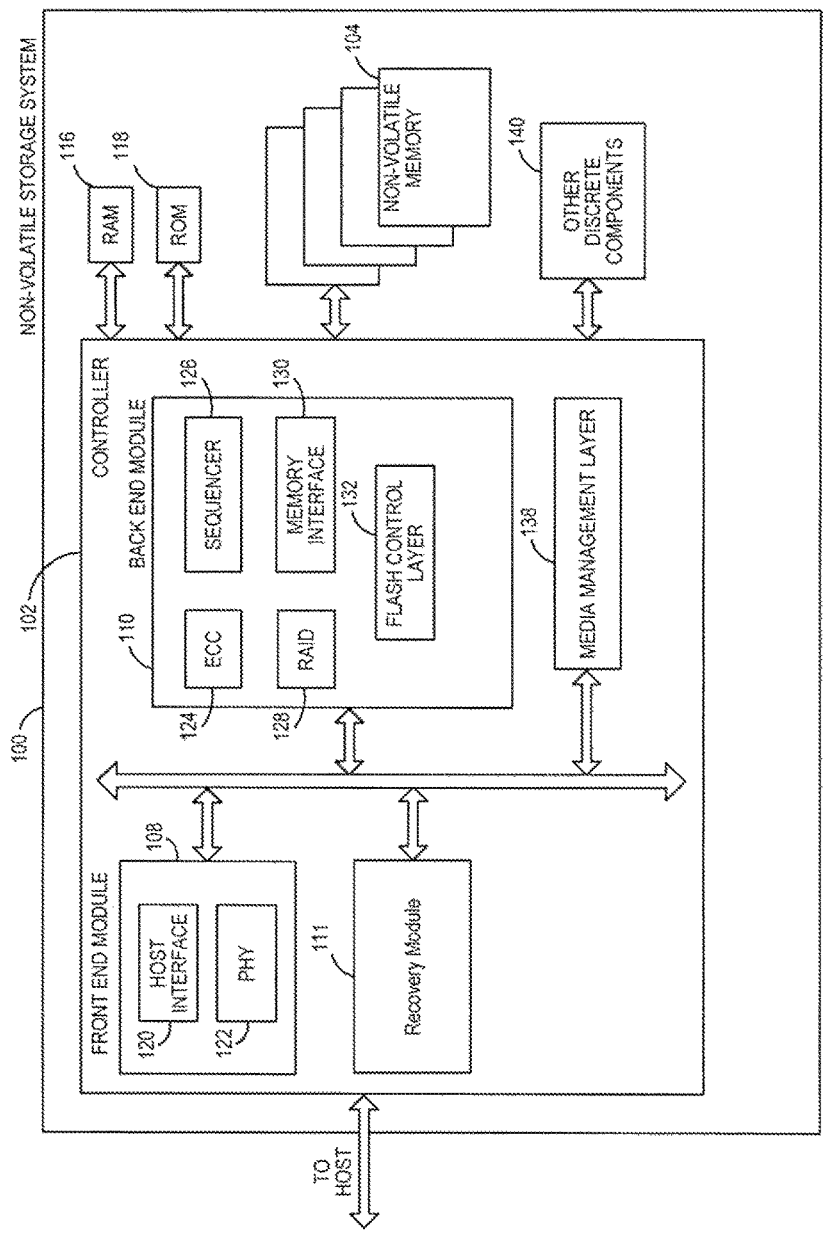
FIG. 2A is a block diagram illustrating exemplary components of the controller of the non-volatile storage system illustrated in FIG. 1A according to an embodiment.

By way of introduction, the below embodiments relate to a storage system and method for recovering data corrupted in a host memory buffer. In one embodiment, a storage system is provided comprising a non-volatile memory and a controller in communication with the non-volatile memory. The controller is configured to receive a logical-to-physical map from a volatile memory of a host for storage in the storage system's non-volatile memory; determine if there is an error in an entry in the logical-to-physical map; in response to determining that there is no error in the logical-to-physical map, store the logical-to-physical map in the non-volatile memory; and in response to determining that there is an error in an entry in the logical-to-physical map, attempt to recover the entry from a location in the storage system before storing the logical-to-physical map in the non-volatile memory.

In some embodiments, the controller is configured to attempt to recover the entry by checking a log of recent transactions stored in the storage system.

In some embodiments, in response to the entry not being in the log of recent transactions, the controller is further configured to determine if the entry is stored in the non-volatile memory by checking a log file in the storage system.

In some embodiments, in response to determining that the entry is not stored in the non-volatile memory, the controller is further configured to search open blocks in the non-volatile memory for information that can be used to recover the entry.

In some embodiments, each entry in the logical-to-physical map is associated with an error detection code, and wherein the controller is configured to determine if there is an error in an entry in the logical-to-physical map by checking the error detection code for that entry.

In some embodiments, the error detection code comprises cyclic redundancy check (CRC) bits.

In some embodiments, the non-volatile memory comprises a three-dimensional memory array.

In some embodiments, the storage system is embedded in the host.

In some embodiments, the storage system is removably connected to the host.

In another embodiment, a method for recovering control data for a non-volatile memory is provided. The method, which can be performed by a controller of a storage system, comprises detecting an error in control data for the non-volatile memory, wherein the control data is stored in volatile memory; and in response to detecting that there is an error in the control data, attempting to correct the control data from another source before storing the control data in the non-volatile memory.

In some embodiments, attempting to correct the control data from another source comprises determining if the control data is contained in a log of recent transactions in the volatile memory.

In some embodiments, in response to determining that the control data is not contained in the log of recent transactions in the storage system, determining if the control data is stored in the non-volatile memory.

In some embodiments, the controller determines if the control data is stored in the non-volatile memory by checking a log file in the storage system.

In some embodiments, in response to determining that the control data is not stored in the non-volatile memory, searching open blocks in the non-volatile memory for information that can be used to recover the control data.

In some embodiments, the control data comprises a logical-to-physical address map.

In some embodiments, the control data is associated with an error detection code, and wherein the controller is configured to determine if there is an error in the control data by checking the error detection code.

In some embodiments, the error detection code comprises cyclic redundancy check (CRC) bits.

In some embodiments, the volatile memory is in the storage system.

In some embodiments, the volatile memory is in a host in communication with the storage system.

In some embodiments, the non-volatile memory comprises a three-dimensional memory array.

In some embodiments, the storage system is embedded in a host.

In some embodiments, the storage system is removably connected to a host.

In another some embodiment, a storage system comprising: a non-volatile memory; means for receiving a logical-to-physical map from a volatile memory of a host for storage in the storage system's non-volatile memory; means for determining if there is an error in an entry in the logical-to-physical map; means for in response to determining that there is no error in the logical-to-physical map, storing the logical-to-physical map in the non-volatile memory; and means for in response to determining that there is an error in an entry in the logical-to-physical map, attempting to recover the entry from a location in the storage system before storing the logical-to-physical map in the non-volatile memory.

Other embodiments are possible, and each of the embodiments can be used alone or together in combination. Accordingly, various embodiments will now be described with reference to the attached drawings.

Exemplary Embodiments

Storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, storage system 100 may be a card based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment the host 252 has a host memory buffer 254, which will be discussed in more detail below. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include a recovery module 111, which is configured to recover data that is corrupted in the HMB 254 or the volatile memory 116. Implementation of the functionality of these modules will be discussed in more detail below.

Referring again to modules of the controller 102, a buffer manager/bus controller (not shown) manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 (also known as a flash interface module) generates command sequences, such as program and erase command sequences, and schedules those sequences to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. It one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the physical layer interface 122, RAID module (not shown), media management layer 138 and buffer management/bus controller (not shown) are optional components that are not necessary in the controller 102.

Figure 2B:
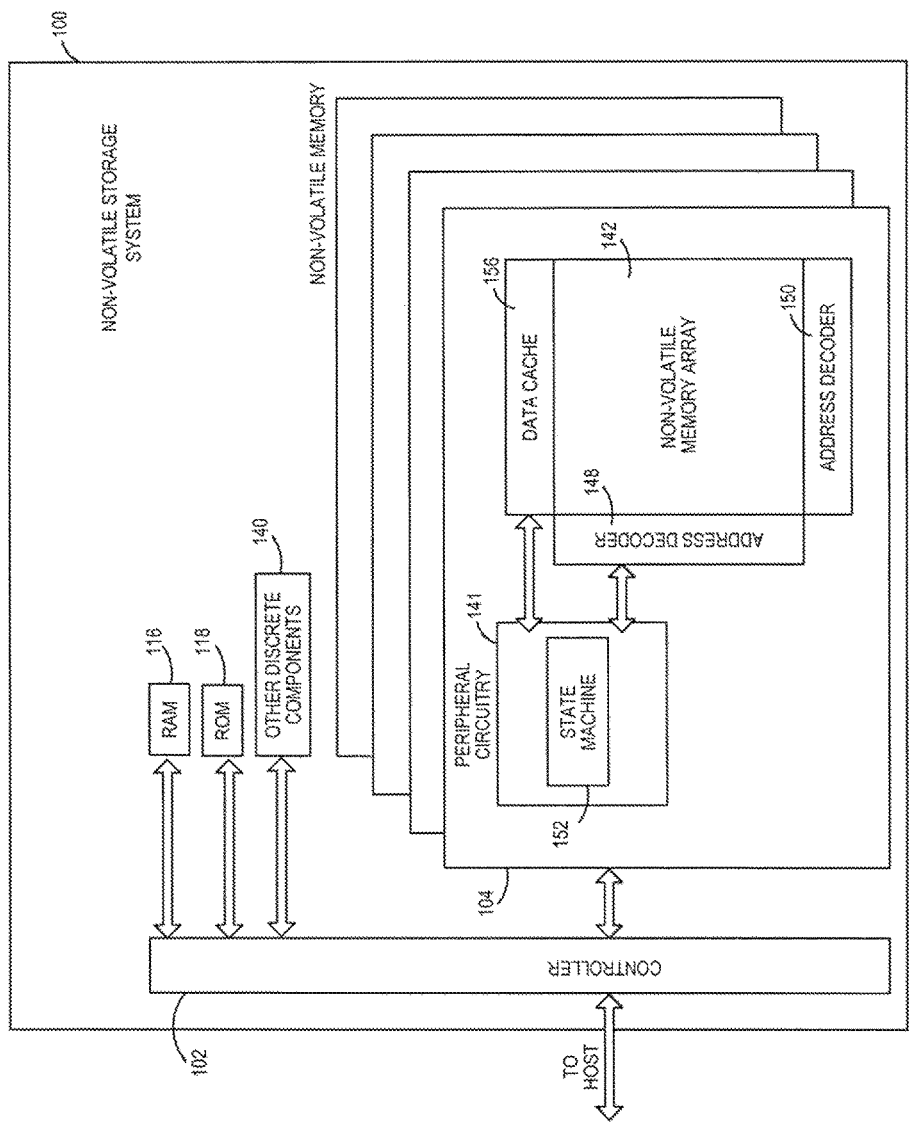
FIG. 2B is a block diagram illustrating exemplary components of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data.

Peripheral circuitry 141 includes a state machine 152 that provides status information to controller 102. The circuitry 141 can provide additional functionality, which will be described in more detail below. In general, "circuitry" can include one or more components and be a pure hardware implementation and/or a combined hardware/software (or firmware) implementation. Accordingly, "circuitry" can take the form of one or more of a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example.

In this embodiment, the non-volatile memory 104 of the storage system 100 is organized by physical addresses. The host 252 uses logical addresses to read data from and/or write data to the storage system 100, and the storage system 100 stores a logical-to-physical address map (sometimes referred to herein as a Flash Translation Layer (FTL) table or just "table") that the controller 102 uses to translate a logical address from the host into a physical address of the non-volatile memory 104. For simplicity, the phrase "logical address map" may refer to the entire logical address map or portion(s) of the logical address map. Also, the phrases "map" and "table" will be used interchangeably herein.

Figure 3:
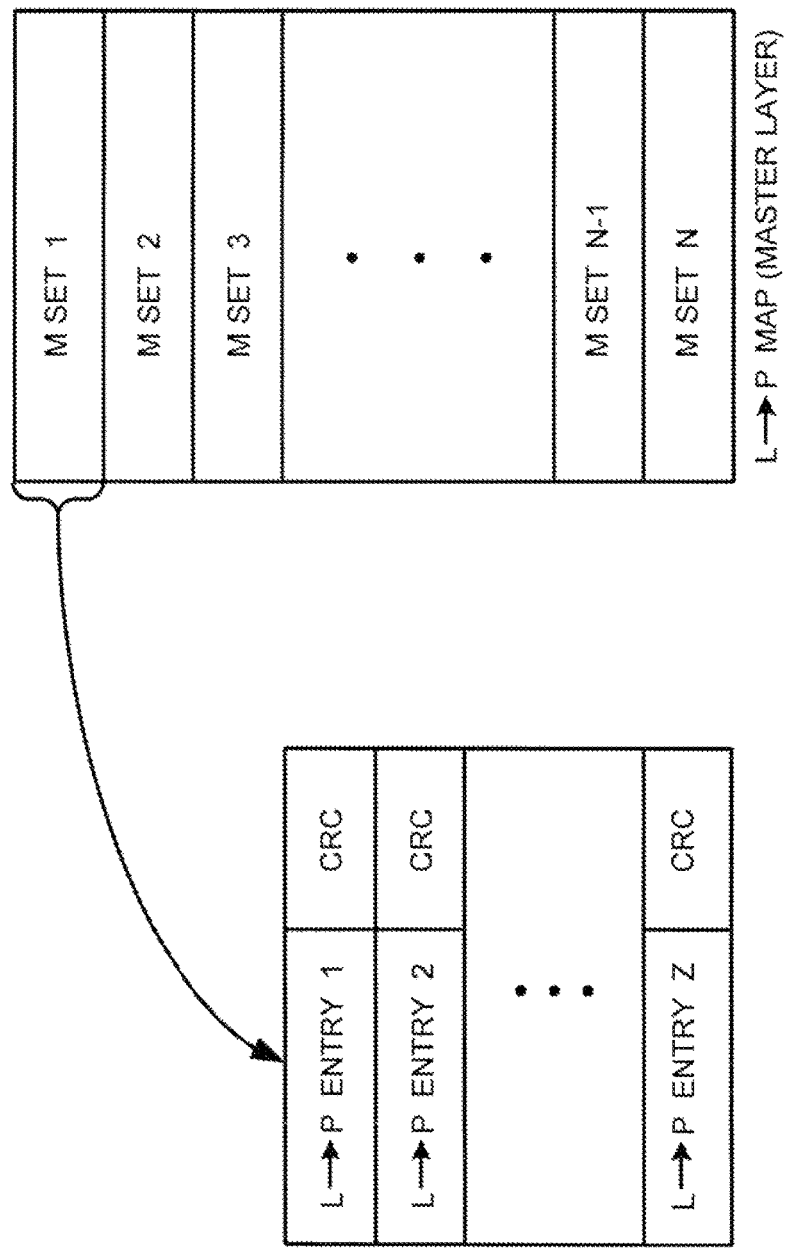
FIG. 3 is an illustration of a logical-to-physical address map of an embodiment.

Any form of a logical-to-physical address map can be used, and FIG. 3 is an illustration of one particular logical-to-physical address map. It should be noted that this illustration is just an example, and other forms of a logical-to-physical address map can be used. Accordingly, the details of this logical-to-physical address map should not be read into the claims unless expressly recited therein.

As shown in FIG. 3, the logical-to-physical address map of this embodiment is organized into a plurality of "master sets" (or "M set"), where the entire collection of master sets (e.g., in one embodiment, 1,000) is referred to as the "master layer" (or "M layer"). Each M set contains a plurality of entries (each M set can have the same or different number of entries), and each entry contains a translation of a logical address (sometimes referred to herein as a logical block address (LBA)) to a physical address of the memory 104. As also shown in FIG. 3, each entry contains an error detecting code, which, in this example is a cyclic redundancy check (CRC) code. Although CRC is used in this example, it should be understood that other types of error detecting codes can be used, including, but not limited to, repetition codes, parity bits, checksums, and cryptographic hash functions. Accordingly, a particular type of error detecting code should not be read into the claims unless expressly recited therein. Also, while the phrase "error detecting code" is being used, it should be understood that code that also allows for an error to be corrected can be encompassed by the phrase "error detecting code." So, as used herein, an "error detecting code" can allow an error to be detected but not corrected, or can allow an error to be both detected and corrected. Also, while FIG. 3 shows an error detection code being associated with each entry in the logical-to-physical address map, in other embodiments, the error detection code is associated with a different level of granularity (e.g., multiple entries, an entire portion of the map, the entire map, etc.).

As explained in the background section above, the logical-to-physical address map is typically stored in the non-volatile memory 104 in order to retain the map even when power is removed from the storage system 100. However, it is faster for the controller 102 to access the logical-to-physical address map from volatile memory (RAM) 116 than from the non-volatile memory 104, because, in general, volatile memory has a faster access time than non-volatile memory. Accordingly, it is preferred to move the logical-to-physical address map from non-volatile memory 104 to volatile memory 116 during use. However, in many situations, the storage system's volatile memory 116 is not large enough to store the entire logical-to-physical address map, so portions of the logical-to-physical address map that are mostly-likely needed are read into the volatile memory 116. The error detecting code, such as cyclic redundancy cheek (CRC) bits, that is stored with the logical-to-physical address map in non-volatile memory 104 can be used by the controller 102 to detect and possibly correct any error in the logical-to-physical address map before it is stored and used in volatile memory 116.

In some environments, volatile memory in the host 252 (sometimes referred to as a "host memory buffer (HMB)" 254 (see FIG. 1C)) is used instead of or in addition to the volatile memory 116 in the storage system 100 to store portions of the logical-to-physical address map. For example, some storage systems may not have volatile memory, and the HMB 254 may serve the same or similar function as volatile memory 116 in a storage system. As another example, even if the storage system 100 has volatile memory 116, the HMB 254 may be used as a "spillover" memory for the logical-to-physical address map, so more portions of the logical-to-physical address map can be stored in volatile memory (i.e., in the storage systems volatile memory 116 and the HMB 254). This can improve performance, as storing more portions of the logical-to-physical address map can decrease the need to access the logical-to-physical address map in the slower, non-volatile memory 104.

As data is being written or moved in the non-volatile memory 104 of the storage system 100, the mapping in the logical-to-physical address map (stored in the volatile memory 116 of the storage system 100 and/or in the HMB 254 host 252) may need to be updated (e.g., due to garbage collection, bad blocks replacement. etc.). The updated map would eventually need to be stored in the non-volatile memory 104, so the updates will be preserved after a power loss. However, in some situations, the HMB 254 in the host 252 may not be "highly-protected" memory, meaning that the memory in the HMB 254 may not have a sufficient level of data reliability to ensure that the map stored in the HMB 254 is an authoritative table. If the updated mapping data stored in the HMB 254 contains errors and is committed to non-volatile memory 104, subsequent use of the mapping data can result in losing track of where certain data is stored. If the risk of this happening is very great, the HMB 254 may considered usable for storing mapping data.

To address this issue, in one embodiment, before committing the mapping data in the HMB 254 to the non-volatile memory 104 of the storage system 100, the mapping data in the HMB 254 is checked to see if it contains an error. If the mapping data in the HMB 254 contains an error, an attempt is made to recover the mapping data from some location in the storage system 100, so the recovered correct data can be stored instead of the incorrect data. In this way, the recovery process of this embodiment allows the HMB 254 to be used to store mapping data, even if the memory is otherwise relatively unreliable.

Specifically, in one embodiment, the controller 102 in the storage system 100 stores error detection code (such as CRC bits, see FIG. 3) in the entries of the logical-to-physical address map that are stored in the HMB 254. Before committing the logical-to-physical address map in the HMB 254 to the non-volatile memory 104, the controller 102 can cheek the error detection code to determine if there is an error in one or more entries of the logical-to-physical address map, If the controller 102 does not detect an error, the controller 102 can store the logical-to-physical address map in the non-volatile memory 104. However, if the, controller 102 detects an error, the controller 102 can attempt to recover the mapping in the entry that contained the error from a location in the storage system 100. This recovery operation will be discussed in more detail in conjunction with the flow chart 400 in FIG. 4, which can be performed by the controller 102 of the storage system 100, for example.

Figure 4:
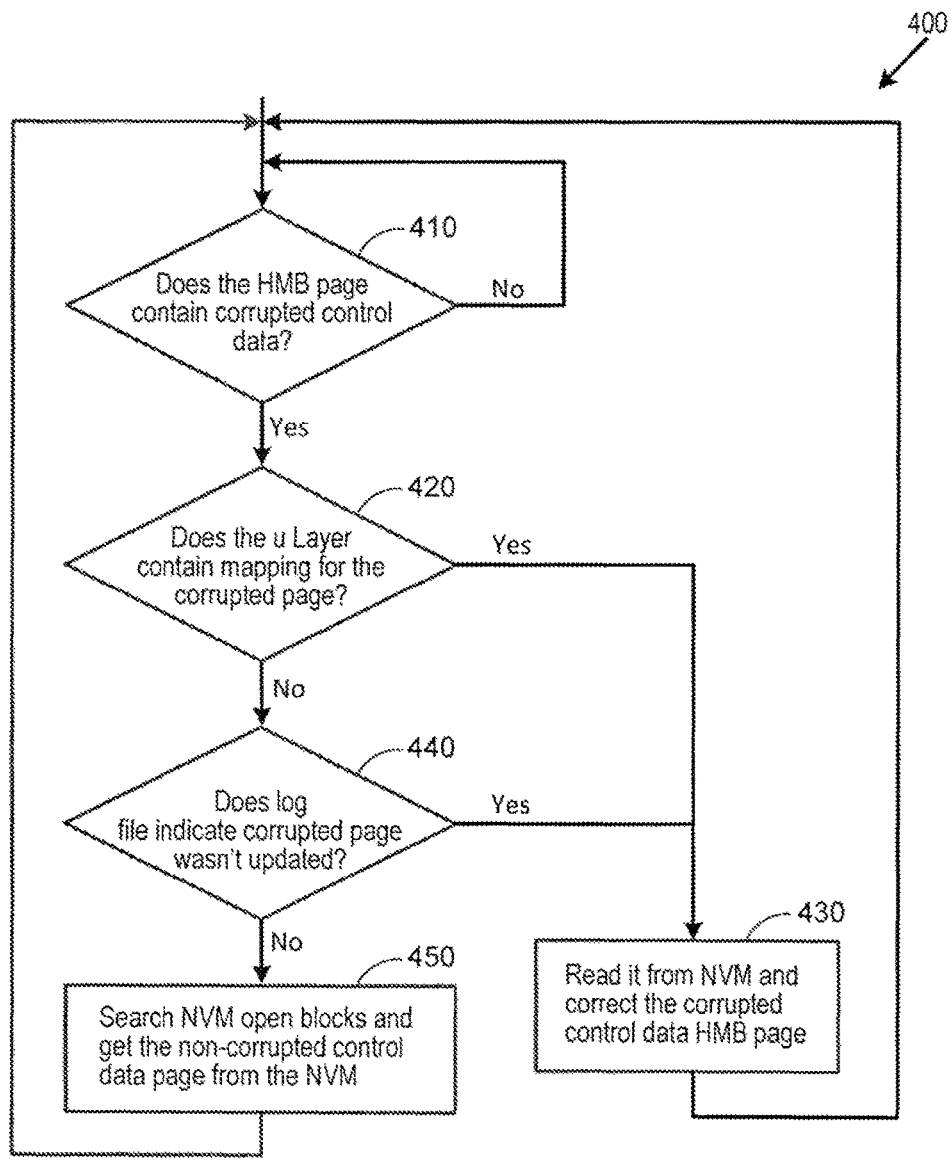
FIG. 4 is a flow chart of a recovery method of an embodiment.
Figure 5:
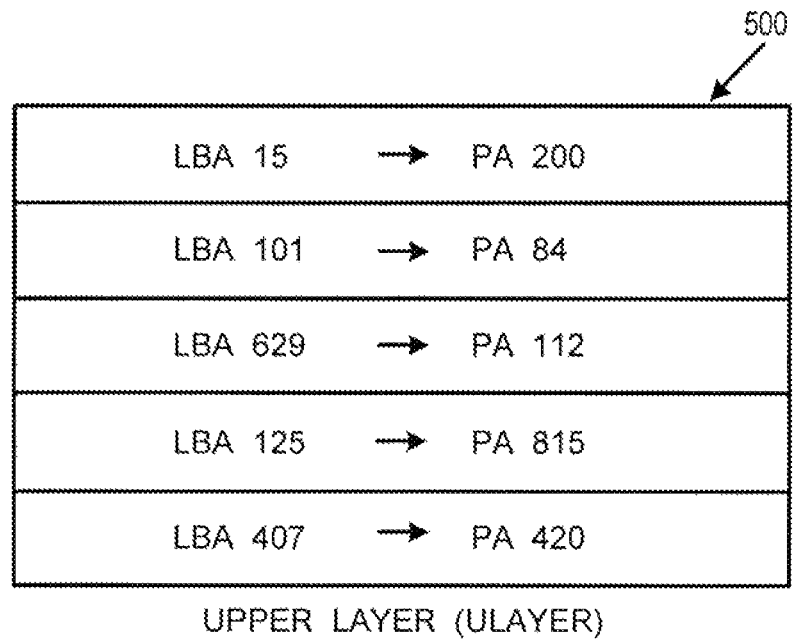
FIG. 5 is an illustration of an upper layer of an embodiment.

As shown in FIG. 4, the controller 102 first determines if the logical-to-physical address map read from the HMB 254 is corrupted (act 410). In this embodiment, the logical-to-physical address map is read as a page of data from the HMB 254, and the logical-to-physical address map is referred to as "control data," (As will be explained below, "control data" can refer to data other than a logical-to-physical address map.) As explained above, the controller 102 can determine if the logical-to-physical address map read from the HMB 254 is corrupted by checking the CRC (or other error detection code) code associated with each entry of the map. If the logical-to-physical address map read from the HMB 254 is corrupted, the controller 102 then attempts to recover the corrupted mapping information from a location in the storage system 100. For example, the non-volatile memory 104 of the storage system 100 may store a log (e.g., an "upper layer" (or ulayer) 500 (see FIG. 5)) of recent changes made to the logical-to-physical address map stored in the HMB 254. The controller 102 can check this recent-transactions log to see if it contains mapping for the corrupted page (act 420). If it does, the controller 102 can read the entry from the recent-transactions log from the non-volatile memory 104 and correct the corrupted data read from the HMB 254 (act 430).

Figure 6:
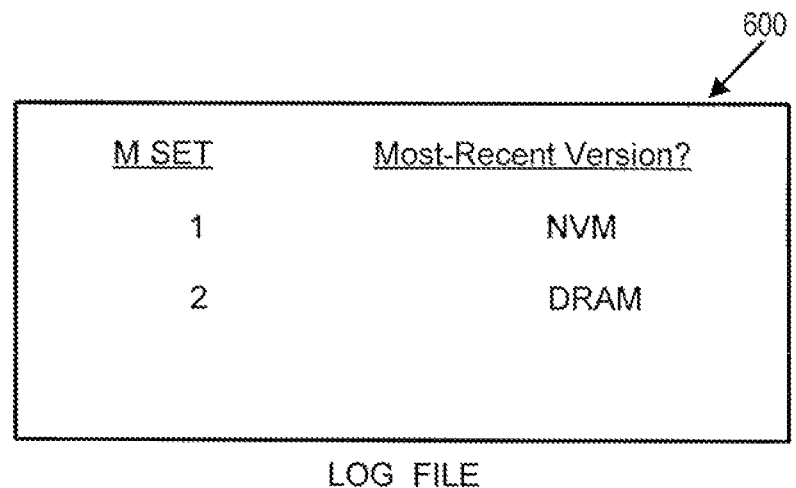
FIG. 6 is an illustration of a log file of an embodiment.

If the recent-transactions log does not contain the mapping for the corrupted page, the controller 102 can then check a log file (see FIG. 6) to determine if it indicates that the corrupted page wasn't updated (act 440). If the corrupted page wasn't updated, then the non-volatile memory 104 would contain a valid, intact version of the entry. In that case, the controller 102 can read the entry from the non-volatile memory 104 and correct the corrupted data read from the HMB 254 (act 430).

Figure 7:
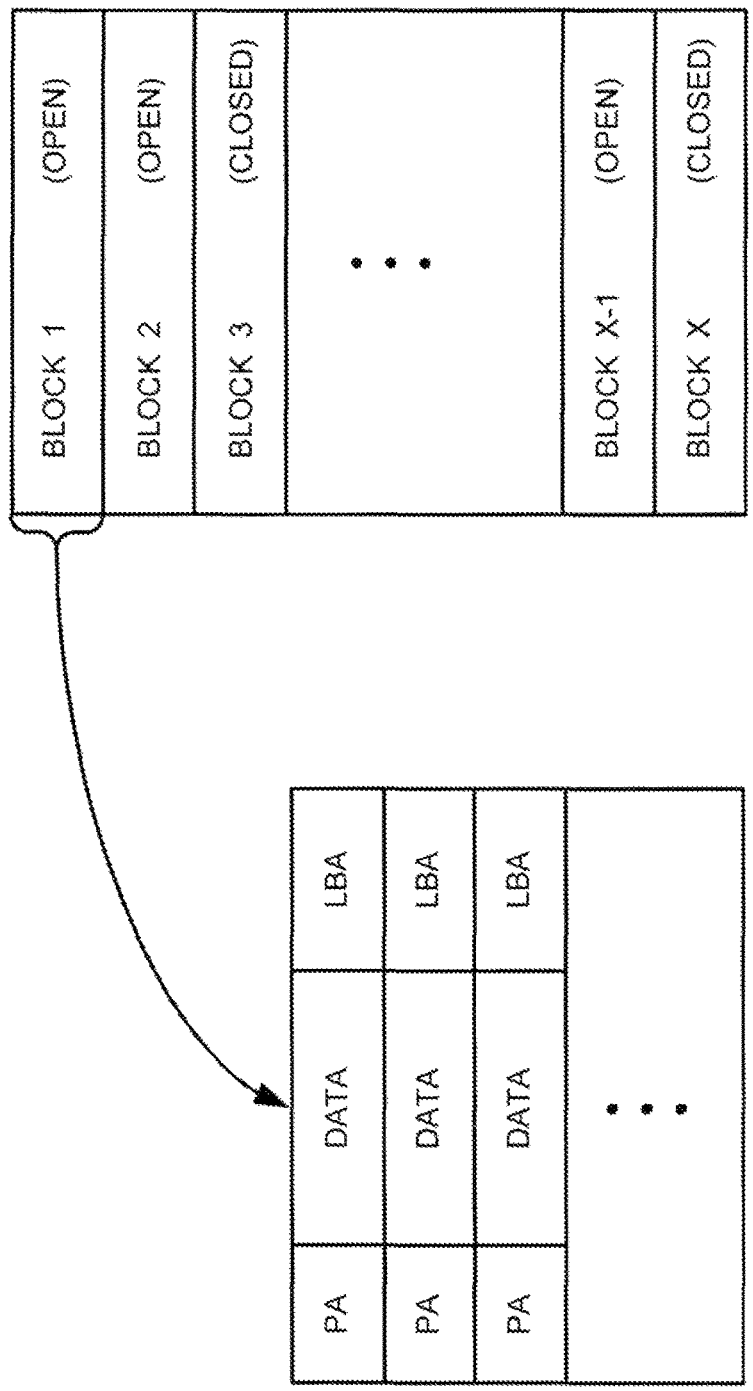
FIG. 7 is an illustration of a plurality of blocks of an embodiment.

If the log file indicates that the corrupted page was updated, the controller 102 can resort to a "brute force" method of searching open blocks in the non-volatile memory 104 for the non-corrupted data (in this embodiment, it is assumed that the data in the open blocks is valid) (act 450). This will be illustrated in conjunction with FIG. 7, which shows a plurality of blocks of memory in the non-volatile memory 104 of the storage system 100. As shown in FIG. 7, the blocks of memory are either classified as being open (i.e., the block is available to store more data) or closed (i.e., the block is unavailable to store more data). Each location in a block has a physical address (PA), and, if it stores data, contains the data and a tag of the logical block address (LBA) used when storing the data. So, the controller 102 can scan open blocks for a given LBA to find its corresponding physical address or can even build a table from the LBA tags in the open blocks.

There are many advantages associated with these embodiments. For example, the embodiments allow storing reliably-authoritative FTL tables in the HMB 254 and provide a method to recover the data if required. This improves system performance.

There are many alternatives that can be used with these embodiments. For example, while these embodiments have been discussed in terms of a logical-to-physical address map, other forms of "non-volatile memory control data" (or "page control data") can be used. Examples of such other forms of control data include, but are not limited to, information on whether a given block is open or closed and how much data in a given block is valid. Accordingly, a logical-to-physical address map should not be read into the claims unless expressly recited therein.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor, such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A storage system comprising:
    a volatile memory;
    a non-volatile memory; and
    a controller in communication with the non-volatile memory, wherein the controller is configured to:
        send, to a host, at least a portion of a logical-to-physical map stored in the non-volatile memory;
        send, to the host, an update to an entry in the at least a portion of the logical-to-physical map, wherein the update is protected by an error detection code;
        receive, from the host, the update to the entry, wherein the update to the entry was stored in a memory in the host that is less reliable than the volatile memory of the storage system;
        determine, using the error detection code, if there is an error in the received update to the entry;
        in response to determining that there is no error in the received update to the entry, store the received update to the entry in the non-volatile memory in the storage system; and
        in response to determining that there is an error in the received update to the entry:
            attempt to recover the update to the entry from a log of changes made to the logical-to-physical map; and
            in response to the attempt to recover the update to the entry from the log being successful, store the recovered update to the entry in the non-volatile memory in the storage system.

2. The storage system of claim 1, wherein the controller is further configured to, in response to the attempt to recover the update to the entry from the log being unsuccessful, search open blocks in the non-volatile memory for information to recover the update to the entry.

3. The storage system of claim 1, wherein the error detection code comprises cyclic redundancy check (CRC) bits.

4. The storage system of claim 1, wherein the non-volatile memory comprises a three-dimensional memory array.

5. The storage system of claim 1, wherein the storage system is embedded in the host.

6. The storage system of claim 1, wherein the storage system is removably connected to the host.

7. A storage system comprising:
    a volatile memory;
    a non-volatile memory;
    means for sending, to a host, at least a portion of a logical-to-physical map stored in the non-volatile memory;
    means for sending, to the host, an update to an entry in the at least a portion of the logical-to-physical map, wherein the update is protected by an error detection code;
    means for receiving, from the host, the update to the entry, wherein the update to the entry was stored in a memory in the host that is less reliable than the volatile memory of the storage system;
    means for determining, using the error detection code, if there is an error in the received update to the entry;
    means for, in response to determining that there is no error in the update to the entry, storing the update to the entry in the non-volatile memory in the storage system; and
    means for, in response to determining that there is no error in the received update to the entry:
        attempting to recover the update to the entry from a log of changes made to the logical-to-physical map; and
        in response to the attempt to recover the update to the entry from the log being successful, storing the recovered update to the entry in the non-volatile memory in the storage system.

8. The storage system of claim 7, wherein the non-volatile memory comprises a three-dimensional memory array.

9. The storage system of claim 7, wherein the storage system is embedded in the host.

10. The storage system of claim 7, wherein the storage system is removably connected to the host.

11. A method comprising:
    performing the following in a controller in a storage system comprising a non-volatile memory and a volatile memory:
        sending, to a host, at least a portion of a logical-to-physical map stored in the non-volatile memory;
        sending, to the host, an update to an entry in the at least a portion of the logical-to-physical map, wherein the update is protected by an error detection code;
        receiving, from the host, the update to the entry, wherein the update to the entry was stored in a memory in the host that is less reliable than the volatile memory of the storage system;
        determine, using the error detection code, if there is an error in the received update to the entry;
        in response to determining that there is no error in the received update to the entry, store the received update to the entry in the non-volatile memory in the storage system; and in response to determining that there is an error in the update to the entry:
   attempting to recover the update to the entry from a log of changes made to the logical-to-physical map; and
   in response to the attempt to recover the update to the entry from the log being successful, storing the recovered update to the entry in the non-volatile memory in the storage system.

12. The method of claim 11 further comprising, in response to the attempt to recover the update to the entry from the log being unsuccessful, searching open blocks in the non-volatile memory for information to recover the update to the entry.

13. The method of claim 11, wherein the error detection code comprises cyclic redundancy check (CRC) bits.

14. The method of claim 11, wherein the non-volatile memory comprises a three-dimensional memory array.

15. The method of claim 11, wherein the storage system is embedded in the host.

16. The method of claim 11, wherein the storage system is removably connected to the host.

* * * * *